(12) United States Patent  (10) Patent No.: US 9,129,863 B2
Caimi et al.  (45) Date of Patent: Sep. 8, 2015

(54) METHOD TO FORM DUAL CHANNEL GROUP III-V AND SI/GE FINFET CMOS

(71) Applicant: International Business Machines Corporation, Armonk, NY (US)

(72) Inventors: Daniele Caimi, Besenbueren (CH); Lukas Czornomaz, Zurich (CH); Jean Fompeyrine, Waedenswil (CH); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/177,460

(22) Filed: Feb. 11, 2014

(65) Prior Publication Data

US 2015/0228670 A1    Aug. 13, 2015

(51) Int. Cl.
| | |
|---|---|
| H01L 21/8238 | (2006.01) |
| H01L 27/12 | (2006.01) |
| H01L 27/092 | (2006.01) |
| H01L 21/84 | (2006.01) |
| H01L 29/161 | (2006.01) |
| H01L 29/20 | (2006.01) |
| H01L 21/02 | (2006.01) |

(52) U.S. Cl.
CPC ...... *H01L 27/1211* (2013.01); *H01L 21/02532* (2013.01); *H01L 21/02538* (2013.01); *H01L 21/845* (2013.01); *H01L 27/0922* (2013.01); *H01L 29/161* (2013.01); *H01L 29/20* (2013.01); *H01L 21/823821* (2013.01); *H01L 27/0924* (2013.01)

(58) Field of Classification Search
CPC ................... H01L 21/823821; H01L 27/0924
See application file for complete search history.

(56) References Cited

U.S. PATENT DOCUMENTS

| | | | |
|---|---|---|---|
| 6,835,618 B1 * | 12/2004 | Dakshina-Murthy et al. | 438/256 |
| 6,855,582 B1 * | 2/2005 | Dakshina-Murthy et al. | 438/157 |
| 7,291,886 B2 | 11/2007 | Doris et al. | |
| 7,485,506 B2 | 2/2009 | Doris et al. | |

(Continued)

FOREIGN PATENT DOCUMENTS

| | | |
|---|---|---|
| CN | 103021815 A | 12/2012 |
| CN | 103021927 A | 4/2013 |
| WO | 2013152176 A1 | 10/2013 |

OTHER PUBLICATIONS

Dohrman, Carl Lawrence; "Substrate engineering for monolithic integration of III-V semiconductors with Si CMOS technology," 2008, Massachusetts Institute of Technology (MIT); (172 pages).

*Primary Examiner* — Steven J Fulk
(74) *Attorney, Agent, or Firm* — Harrington & Smith

(57) ABSTRACT

A method includes providing a structure having a substrate, a first insulating layer on the substrate, a first semiconductor material layer on the first insulating layer, a second insulating layer on the first semiconductor layer in a first portion of the structure and a second semiconductor layer of a second, different semiconductor material on the second insulating layer in the first portion. The method further includes growing additional first semiconductor material on the first semiconductor layer in a second portion of the structure forming a regrown semiconductor layer; forming first fins in the regrown semiconductor layer and second fins in the second semiconductor layer; and forming gate structures upon the first and second fins. A height difference, relative to a surface of the first insulating layer, of the gate structures formed upon the first fins and the gate structures formed upon the second fins is less than a predetermined value.

15 Claims, 19 Drawing Sheets

(56) References Cited

U.S. PATENT DOCUMENTS

| | | |
|---|---|---|
| 7,754,560 B2 * | 7/2010 | Burnett et al. ............... 438/212 |
| 7,932,123 B2 | 4/2011 | Rogers et al. |
| 8,120,060 B2 | 2/2012 | Fitzgerald |
| 8,466,012 B1 * | 6/2013 | Chang et al. ................. 438/149 |
| 8,525,228 B2 | 9/2013 | Javey et al. |
| 2004/0108559 A1 | 6/2004 | Sugii et al. |
| 2004/0217434 A1 | 11/2004 | Lee et al. |
| 2004/0227187 A1 | 11/2004 | Cheng et al. |
| 2005/0118783 A1 | 6/2005 | Oh et al. |
| 2005/0130358 A1 * | 6/2005 | Chidambarrao et al. ..... 438/197 |
| 2005/0224875 A1 * | 10/2005 | Anderson et al. ............ 257/347 |
| 2005/0239242 A1 * | 10/2005 | Zhu et al. ..................... 438/199 |
| 2006/0049460 A1 * | 3/2006 | Chen et al. .................... 257/347 |
| 2006/0084212 A1 | 4/2006 | Anderson et al. |
| 2006/0113603 A1 * | 6/2006 | Currie ........................... 257/368 |
| 2006/0170045 A1 * | 8/2006 | Yan et al. ...................... 257/347 |
| 2006/0292770 A1 * | 12/2006 | Wu et al. ....................... 438/187 |
| 2007/0281446 A1 * | 12/2007 | Winstead et al. ............. 438/478 |
| 2008/0227241 A1 * | 9/2008 | Nakabayashi et al. ........ 438/150 |
| 2009/0057761 A1 * | 3/2009 | Kim et al. ..................... 257/344 |
| 2009/0148986 A1 | 6/2009 | Cheng et al. |
| 2009/0159972 A1 * | 6/2009 | Jakschik et al. .............. 257/350 |
| 2010/0151689 A1 | 6/2010 | Gmitter et al. |
| 2010/0219509 A1 | 9/2010 | He et al. |
| 2012/0061728 A1 | 3/2012 | Javey et al. |
| 2013/0075818 A1 * | 3/2013 | Lee et al. ...................... 257/347 |
| 2013/0175618 A1 * | 7/2013 | Cheng et al. .................. 257/347 |
| 2013/0320294 A1 * | 12/2013 | Cappellani et al. ............... 257/9 |
| 2013/0337637 A1 * | 12/2013 | Cheng et al. .................. 438/478 |
| 2014/0008730 A1 * | 1/2014 | Mitard et al. ................. 257/369 |
| 2014/0070322 A1 * | 3/2014 | Jacob et al. ................... 257/368 |
| 2014/0091392 A1 * | 4/2014 | Takada et al. ................. 257/351 |
| 2014/0217467 A1 * | 8/2014 | Pawlak et al. ................. 257/183 |
| 2014/0273508 A1 * | 9/2014 | Li et al. ......................... 438/759 |
| 2014/0339643 A1 * | 11/2014 | Cheng et al. .................. 257/369 |
| 2015/0021699 A1 * | 1/2015 | Ando et al. ................... 257/368 |

* cited by examiner

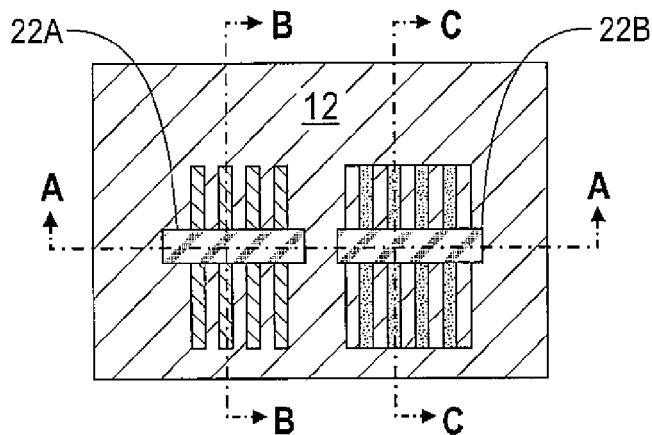
FIG. 11
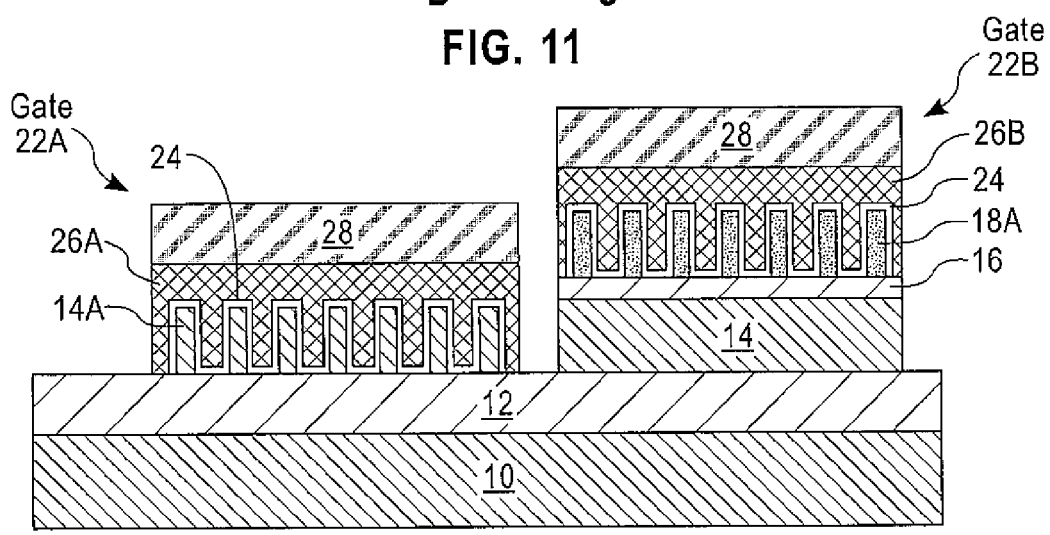
FIG. 11A
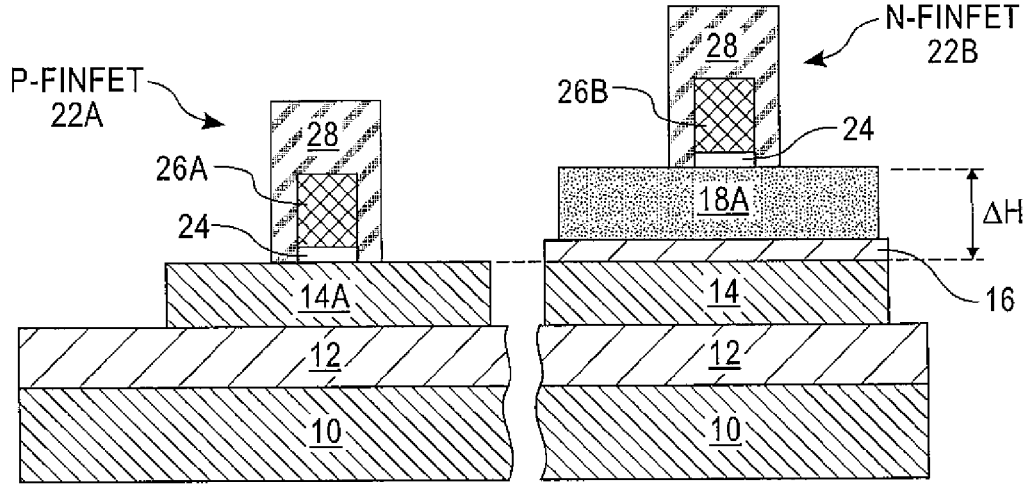
FIG. 11B          FIG. 11C

METHOD TO FORM DUAL CHANNEL GROUP III-V AND SI/GE FINFET CMOS

TECHNICAL FIELD

The exemplary embodiments of this invention relate generally to semiconductor devices and fabrication techniques and, more specifically, relate to the fabrication of semiconductor transistor devices known as FINFETs, such as those used in logic circuitry, using a semiconductor on insulator substrate, where the semiconductor in one area is comprised of a Group III-V compound material and in another area is comprised of, for example, a Silicon-Germanium (SiGe) compound material.

BACKGROUND

One approach to achieving sub-10 nm geometry devices would co-integrate Si/Ge ($Si_xGe_{1-x}$ where x=0 to 1) with a Group III-V compound semiconductor material (hybrid Group III-V and SiGe). The Group III-V material could be a binary material such, as for example, Gallium Arsenide (GaAs) or Gallium Antimonide (GaSb). The Group III-V material could also be a tertiary material such as, for example, Indium Gallium Arsenide (InGaAs) or Indium Gallium Antimonide (InGaSb).

Wafer bonding could be used to achieve the co-integration of the Si/Ge with the Group III-V material in order to form dual channel substrates. Since bonding two such dissimilar materials is performed via two wafer bonding, it implies that the channels will not be at the same height and thus the device gates formed on the Group III-V channels and the SiGe channels will not be at the same height. This variation in wafer topography can be problematic when performing chemical-mechanical polish (CMP) and other processing steps, especially for replacement gate processing where a gate precursor structure (sometimes referred to as 'dummy' gate structure), needs to be subsequently removed and replaced with a metal gate (stack) and associated gate dielectric.

SUMMARY

In a first aspect of the embodiments of this invention a method is disclosed that comprises providing a structure comprised of a substrate, a first electrically insulating layer overlying a surface of the substrate, and a first semiconductor layer comprised of a first semiconductor material overlying a surface of the first electrically insulating layer. The first semiconductor layer has a first thickness. The structure further comprises a second electrically insulating layer overlying the first semiconductor layer in a first portion of the structure and a second semiconductor layer comprised of a second semiconductor material different from the first semiconductor material overlying the second electrically insulating layer in the first portion. The second semiconductor layer has a second thickness that is greater than the first thickness. The method further comprises growing additional first semiconductor material on the first semiconductor layer in a second portion of the structure to form a regrown semiconductor layer having a third thickness; forming first fins in the regrown semiconductor layer and second fins in the second semiconductor layer; and forming gate structures upon and orthogonal to the first fins and the second fins. As a result of the method a difference in height, relative to the surface of the first electrically insulating layer, of the gate structures formed upon the first fins and the gate structures formed upon the second fins is less than a predetermined value.

In accordance with another aspect of the embodiments of this invention there is described a structure that includes a substrate, a first electrically insulating layer overlying a surface of the substrate, a first semiconductor layer comprised of a first semiconductor material overlying a surface of the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion. The first semiconductor layer has a first thickness and the second semiconductor layer has a second thickness that is greater than the first thickness. The structure further comprises additional first semiconductor material grown on the first semiconductor layer in a second portion of the structure forming a regrown semiconductor layer having a third thickness; first fins formed in the regrown semiconductor layer and second fins formed in the second semiconductor layer; and gate structures disposed upon and orthogonal to the first fins and the second fins. In the structure a difference in height, relative to the surface of the first electrically insulating layer, of the gate structures formed upon the first fins and the gate structures formed upon the second fins is less than a predetermined value.

BRIEF DESCRIPTION OF THE SEVERAL VIEWS OF THE DRAWINGS

In FIGS. 1-5:

FIGS. 1 and 1A show a top view and a cross-sectional view, respectively, of an initial starting structure, where the view of FIG. 1A is taken along the section line 'A' shown in FIG. 1;

FIGS. 2 and 2A show a top view and a cross-sectional view, respectively, of the structure of FIG. 1 after further processing to add additional layers, where the view of FIG. 2A is taken along the section line 'A' shown in FIG. 2;

FIGS. 3 and 3A show a top view and a cross-sectional view, respectively, of the structure of FIG. 2 after further processing to form PFET and NFET active areas, where the view of FIG. 3A is taken along the section line 'A' shown in FIG. 3;

FIGS. 4 and 4A show a top view and a cross-sectional view, respectively, of the structure of FIG. 3 after further processing to differentiate the PFET and NFET active areas, where the view of FIG. 4A is taken along the section line 'A' shown in FIG. 4; and FIGS. 5 and 5A show a top view and a cross-sectional view, respectively, of the structure of FIG. 4 after further front-end processing to define the planar PFET and NFET, where the view of FIG. 5A is taken along the section line 'A' shown in FIG. 5.

FIGS. 6-11 illustrate processing steps for fabricating a dual channel FINFET CMOS device and are provided as a further aid in understanding the embodiments of this invention. In FIGS. 6-11:

FIGS. 6 and 6A show a top view and a cross-sectional view, respectively, of an initial starting structure, where the view of FIG. 6A is taken along the section line 'A' shown in FIG. 6;

FIGS. 7 and 7A show a top view and a cross-sectional view, respectively, of the structure of FIG. 6 after further processing to add additional layers, where the view of FIG. 7A is taken along the section line 'A' shown in FIG. 7;

FIGS. 8 and 8A show a top view and a cross-sectional view, respectively, of the structure of FIG. 7 after further processing to form PFET and NFET active areas, where the view of FIG. 8A is taken along the section line 'A' shown in FIG. 8;

FIGS. 9 and 9A show a top view and a cross-sectional view, respectively, of the structure of FIG. 8 after further processing to differentiate the PFET and NFET active areas, where the view of FIG. 9A is taken along the section line 'A' shown in FIG. 9;

FIGS. 10, 10A, 10B and 10C show a top view and three cross-sectional views of the structure after two sets of fins are defined in a SiGe layer and in a Group III-V layer, where the view of FIG. 10A is taken along the section line 'A' shown in FIG. 10, the view of FIG. 10B is taken along the section line 'B' shown in FIG. 10, and the view of FIG. 10C is taken along the section line 'C' shown in FIG. 10; and FIGS. 11, 11A, 11 and 11C show a top view and three cross-sectional views of the structure after gate structures are defined orthogonally to the fins, where the view of FIG. 11A is taken along the section line 'A' shown in FIG. 11, the view of FIG. 11B is taken along the section line 'B' shown in FIG. 11, and the view of FIG. 11C is taken along the section line 'C' shown in FIG. 11, and where it is shown that the presence of the SiGe layer that underlies the N-type FINFET results in an unacceptable topological variation being created across the wafer.

In FIGS. 12-18:

FIGS. 12 and 12A show a top view and a cross-sectional view, respectively, of an initial starting structure that includes a thin semiconductor seed layer, where the view of FIG. 12A is taken along the section line 'A' shown in FIG. 12;

FIGS. 13 and 13A show a top view and a cross-sectional view, respectively, of the structure of FIG. 12 after further processing to add additional layers, where the view of FIG. 13A is taken along the section line 'A' shown in FIG. 13;

FIGS. 14 and 14A show a top view and a cross-sectional view, respectively, of the structure of FIG. 13 after further processing to form PFET and NFET active areas, where the view of FIG. 14A is taken along the section line 'A' shown in FIG. 14;

FIGS. 15 and 15A show a top view and a cross-sectional view, respectively, of the structure of FIG. 14 after further processing to differentiate the PFET and NFET active areas, where the view of FIG. 15A is taken along the section line 'A' shown in FIG. 15;

FIGS. 16 and 16A show a top view and a cross-sectional view, respectively, of the structure of FIG. 15 after further processing in accordance with embodiments of this invention to epitaxially grow an additional thicker merged layer of semiconductor material on an exposed surface of the seed layer;

FIGS. 17, 17A, 17B and 17C show a top view and three cross-sectional views of the structure of FIG. 16 after two sets of fins are defined in the merged SiGe layer and in the Group III-V layer, where the view of FIG. 17A is taken along the section line 'A' shown in FIG. 17, the view of FIG. 17B is taken along the section line 'B' shown in FIG. 17, and the view of FIG. 17C is taken along the section line 'C' shown in FIG. 17; and FIGS. 18, 18A, 18B and 18C show a top view and three cross-sectional views of the structure after gate structures are defined orthogonally to the fins, where the view of FIG. 18A is taken along the section line 'A' shown in FIG. 18, the view of FIG. 18B is taken along the section line 'B' shown in FIG. 18 (through a fin 34A), and the view of FIG. 18C is taken along the section line 'C' shown in FIG. 18 (through a fin 18A).

DETAILED DESCRIPTION

Reference is first made to FIGS. 1-5 for showing a dual channel planar CMOS fabrication process. FIGS. 1-5, as well as the other Figures subsequently described below, generally show enlarged cross-section and top views of structures that can be considered as initial and intermediate structures formed during the fabrication of transistor devices. In any or all of the Figures the various layer thicknesses and other dimensions may not be drawn to scale.

Figure 1:
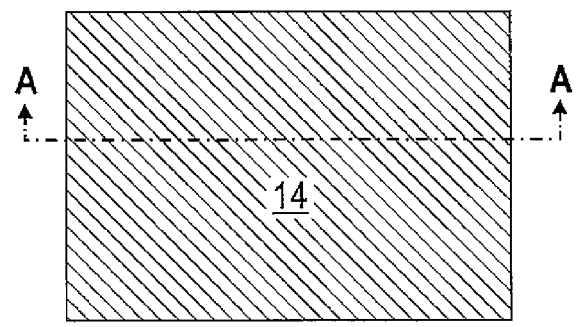
FIGS. 1-5 illustrate processing steps for fabricating a dual channel planar CMOS device and are provided as an aid in understanding the embodiments of this invention.
Figure 1A:
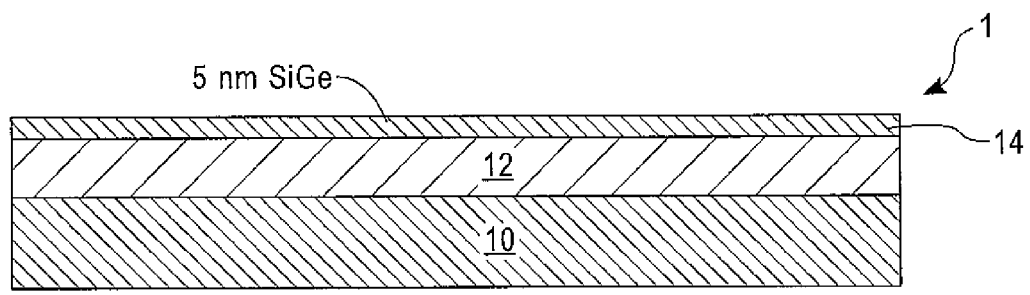

FIGS. 1 and 1A show a top view and a cross-sectional view, respectively, of an initial starting structure. The view of FIG. 1A is taken along the section line 'A' shown in FIG. 1. An initial structure 1 includes a substrate 10, such as a (bulk) Si substrate or a Si/Ge substrate, having an overlying dielectric layer (e.g., $SiO_2$) that can be referred to as a buried oxide (BOX) layer 12. The thicknesses of the Si substrate 10 and the BOX layer 12 can be any suitable thicknesses. In that the substrate 10 is not an active portion of subsequently fabricated transistor devices it can be composed of any suitable supportive structural material. Over the BOX layer 12 is a layer 14 of semiconductor material such as SiGe and the structure 1 may be characterized as being a semiconductor-on-insulator substrate. The SiGe layer 14 can have a thickness of, for example, about 5 nm that corresponds to a desired channel thickness of a subsequently formed PFET. In the ensuing description the semiconductor layer 14 will be assumed to be a SiGe layer although the invention is not limited for use with only SiGe.

As was noted above, references herein to SiGe can be considered to refer to $Si_xGe_{1-x}$ where x=0 to 1.

The SiGe material is desirable for the PFET area due its characteristic high hole mobility, as compared to most Group III-V material which typically exhibits a higher electron mobility (as compared to SiGe). Other materials with a high hole mobility can also be used such as, by example only, GaSb or InGaSb.

Figure 2:
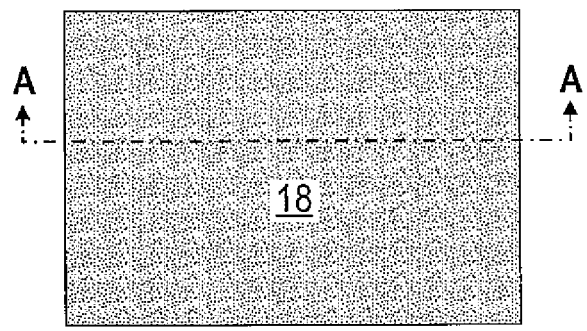
Figure 2A:
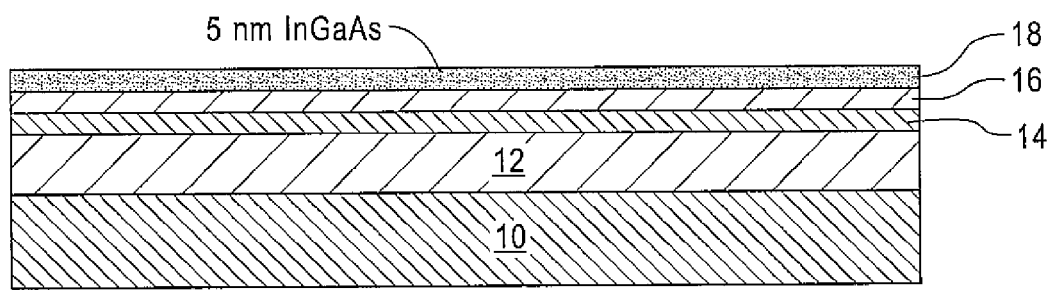

FIGS. 2 and 2A show a top view and a cross-sectional view, respectively, of the structure of FIG. 1 after further processing to add additional layers. The view of FIG. 2A is taken along the section line 'A' shown in FIG. 2. To a top surface of the SiGe layer 14 is formed, such as by deposition or by wafer bonding, a second (thin) dielectric layer 16, such as a layer of $SiO_2$ or $Al_2O_3$, and an overlying layer 18 of a selected Group III-V material such as a layer of GaAs, GaSb, InGaAs, or InGaSb. In other embodiments a quaternary Group III-V material could be used. The Group III-V layer 18, shown for illustration purposes and not as a limitation as a layer of InGaAs, could have a thickness of about, for example, 5 nm and corresponds to a desired channel thickness of a subsequently formed NFET.

Wafer bonding is a well-known technique and can be achieved, for example, by placing the two structures to be bonded in contact and then applying pressure and heat to join the two structures along their respective contact surfaces.

Figure 3:
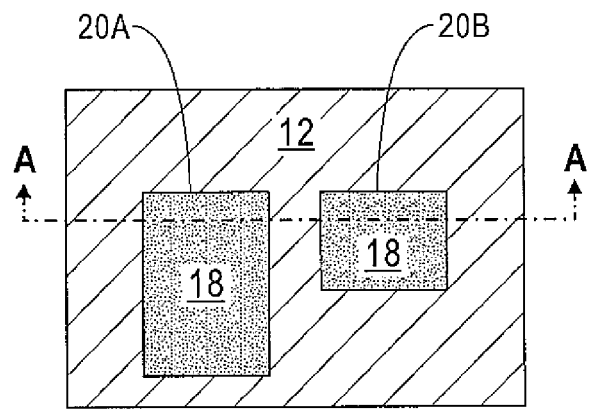
Figure 3A:
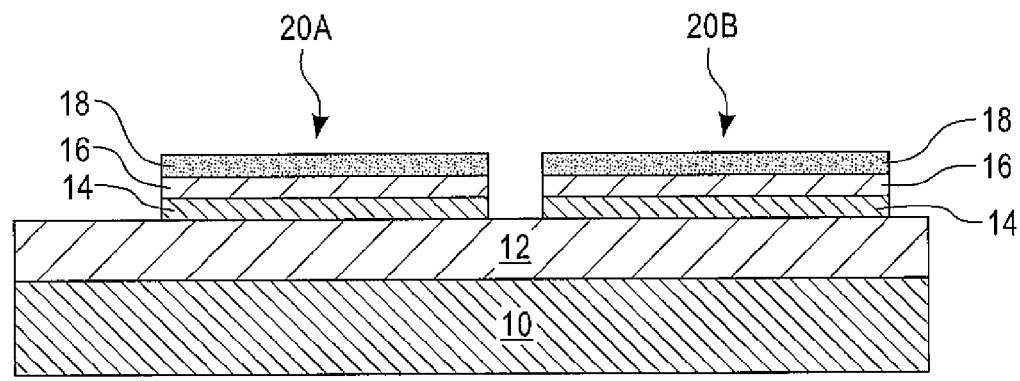

FIGS. 3 and 3A show a top view and a cross-sectional view, respectively, of the structure of FIG. 2 after further processing to form PFET and NFET active areas. The view of FIG. 3A is taken along the section line 'A' shown in FIG. 3. In this step active PFET and NFET region definition is accomplished thereby forming a first, PFET, active area 20A and a second, NFET, active area 20B. The active areas 20A, 20B could also be referred to as 'islands' or 'mesas'. In this step an etching process is performed after masking the areas 20A and 20B. The etching process could be, e. g., a reactive ion etch (RIE) and/or a wet chemical etch and/or a dry chemical etch, to remove intervening material so that the active areas 20A and 20B are electrically separated and isolated from one another by the underlying BOX layer 12.

Figure 4:
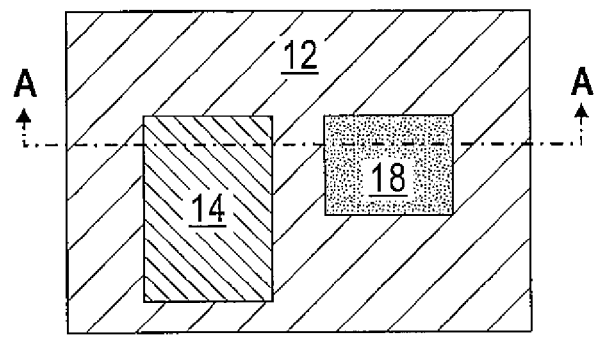
Figure 4A:
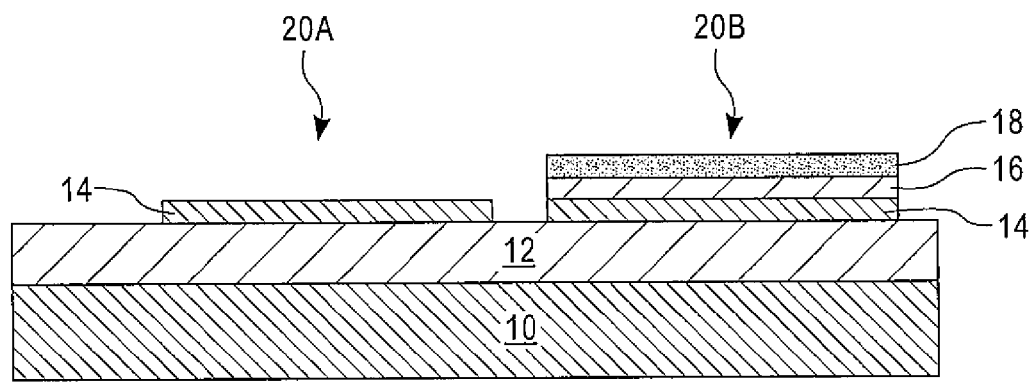

FIGS. 4 and 4A show a top view and a cross-sectional view, respectively, of the structure of FIG. 3 after further processing to differentiate the PFET and NFET active areas. The view of FIG. 4A is taken along the section line 'A' shown in FIG. 4. In this step a differentiation is made between the PFET active region 20A and the NFET active region 20B by masking the NFET active region 20B and then removing the dielectric layer 16 and the overlying layer 18 of the selected Group III-V material from the PFET region 20A to expose the SiGe layer 14.

Figure 5:
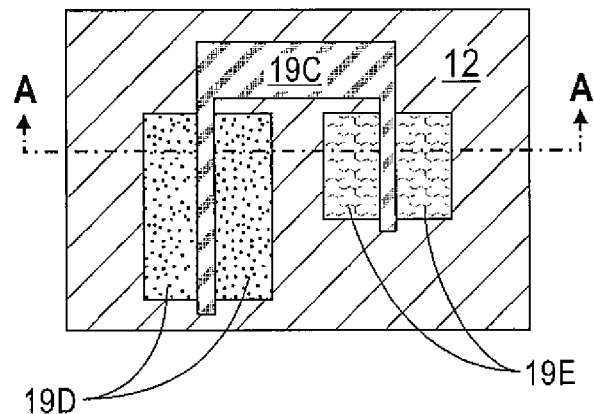
Figure 5A:
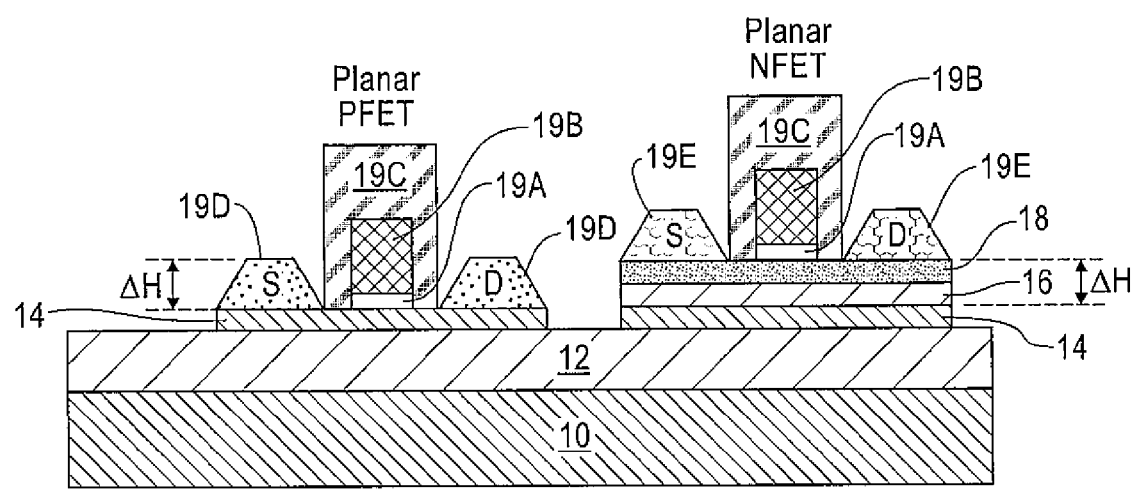

FIGS. 5 and 5A show a top view and a cross-sectional view, respectively, of the structure of FIG. 4 after further front-end processing to define the PFET and the NFET. The view of FIG. 5A is taken along the section line 'A' shown in FIG. 5. In this step gate structures are formed. The gates structures can be formed, when fabricating for example metal gates as opposed to replacement gate structures, by depositing a gate dielectric 19A followed by the deposition of a desired gate metal 19B. An insulating nitride layer 19C is then deposited over the gates forming spacers at least on sidewalls of the gate structures. Sources (S) and drains (D) 19D and 19E are then defined and deposited. For the PFET the S/Ds 19D can be N+SiGe and for the NFET the S/Ds 19E can be N+ Group III-V material.

Further processing can then be performed to deposit an inter-layer dielectric (ILD) layer followed by planarization (e.g., by CMD). Apertures are opened in the ILD layer and suitable contact metallization is then applied to the source, drain and the gate (stack/structure) of each of the planar PFET and NFET thus formed.

For the dual-channel planar CMOS structure formed as above the channel thicknesses of the PFET and the NFET are sufficiently thin such that an induced gate height difference between the PFET and the NFET (shown as ΔH in FIG. 5A) can be assumed to be within some predetermined threshold tolerance, e.g., ΔH=n-channel thickness (thickness of layer 18)+thickness of the second BOX layer 16 <15 nm.

It should be noted that the value 15 nm represents but one non-limiting example of some predetermined maximum acceptable difference between the gate heights, and hence the variation in wafer topology, in order to accommodate subsequent processing such as a CMP process performed after the ILD layer is formed. In other circumstances the maximum acceptable difference between the gate heights ΔH can be more or less than 15 nm depending on, for example, fabrication tool and process tolerances.

Reference will now be made to the FIGS. 6-11 that provide an aid in understanding a problem that can arise when fabricating a dual channel FINFET CMOS device, as opposed to the dual channel planar CMOS case described above with reference to FIGS. 1-5. In these Figures certain layers that can be substantially the same as those shown in FIGS. 1-5 may be numbered accordingly.

Figure 6:
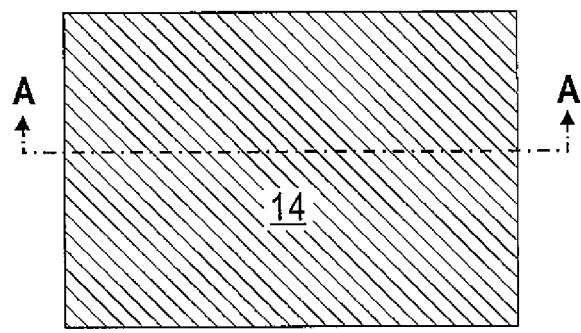
Figure 6A:
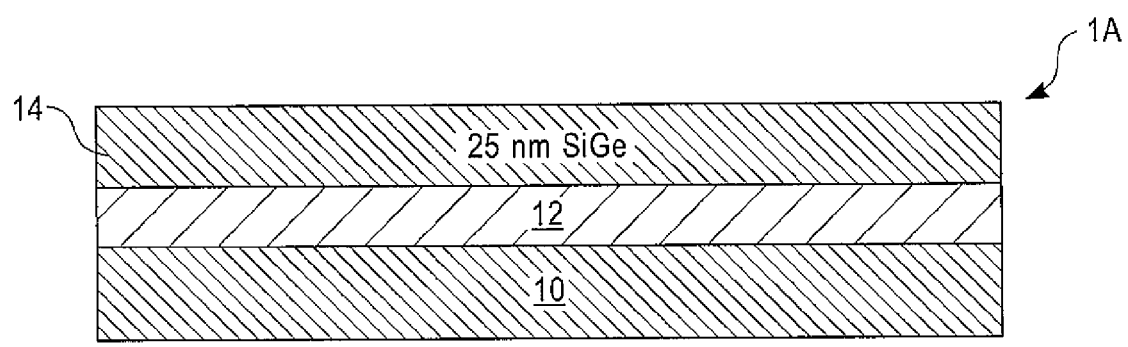

FIGS. 6 and 6A show a top view and a cross-sectional view, respectively, of an initial starting structure 1A. The view of FIG. 6A is taken along the section line 'A' shown in FIG. 6. The initial structure 1A includes the substrate 10, such as a (bulk) Si substrate or a Si/Ge substrate, and the overlying BOX layer 12. As before the thicknesses of the Si substrate 10 and the BOX layer 12 can be any suitable thicknesses. Over the BOX layer 12 is the layer 14 of semiconductor material such as SiGe. In this FINFET embodiment the SiGe layer 14 has a thickness corresponding to a desired fin height of the subsequently formed PFET (P-type FINFET) and can be, for example, about 25 nm. In the ensuing description the semiconductor layer 14 will be assumed to be a SiGe layer although the invention is not limited for use with only SiGe.

Figure 7:
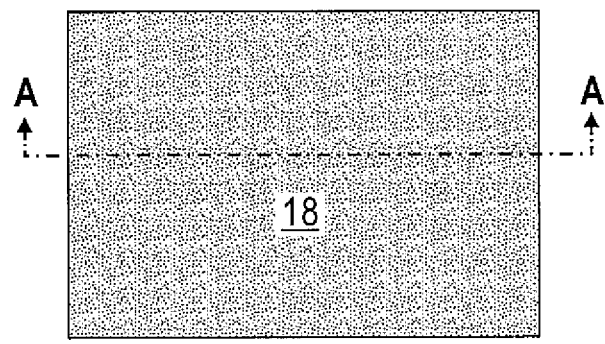
Figure 7A:
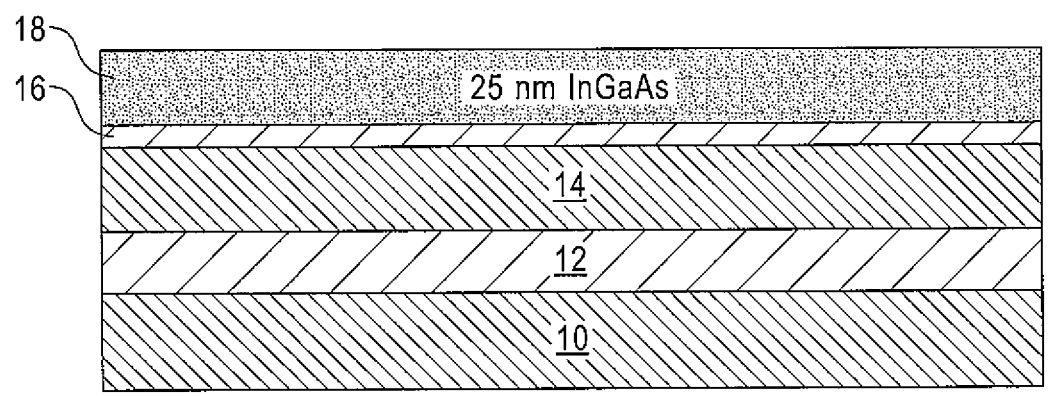

FIGS. 7 and 7A show a top view and a cross-sectional view, respectively, of the structure of FIG. 6 after further processing to add additional layers. The view of FIG. 7A is taken along the section line 'A' shown in FIG. 7. To a top surface of the SiGe layer 14 is formed, such as by deposition or by wafer bonding, the second (thin) dielectric layer 16, such as a layer of $SiO_2$ or $Al_2O_3$, and the overlying layer 18 of the selected Group III-V material. The Group III-V layer 18, shown again for illustration purposes and not as a limitation as a layer of InGaAs, could have a thickness of about, for example, 25 nm that corresponds to a desired fin height of the subsequently formed NFET (N-type FINFET). A suitable and range of thickness for the second BOX layer 16 could be, for example, about 5 nm to 10 nm.

Figure 8:
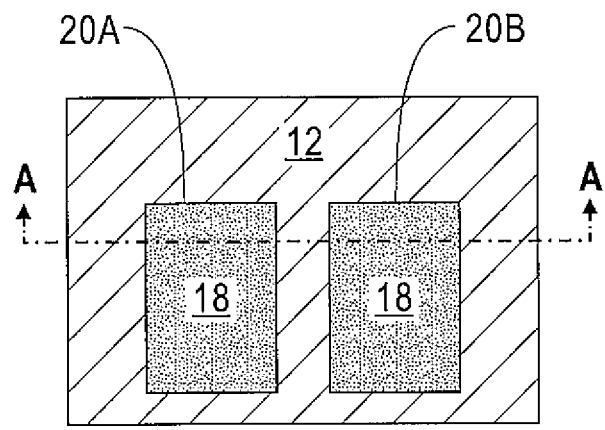
Figure 8A:
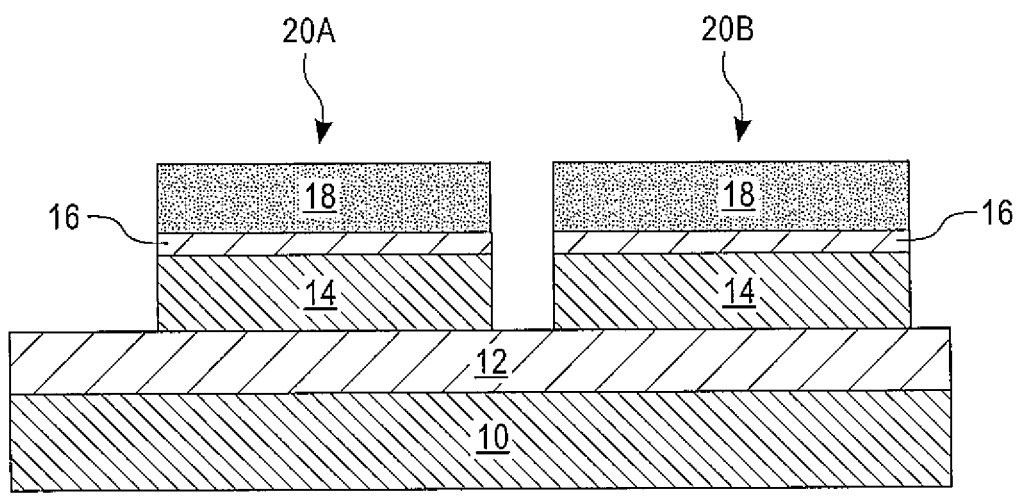

FIGS. 8 and 8A show a top view and a cross-sectional view, respectively, of the structure of FIG. 7 after further processing to form PFET and NFET active areas. The view of FIG. 8A is taken along the section line 'A' shown in FIG. 8. In this step active PFET and NFET region definition is accomplished by forming the first, PFET, active area 20A and the second, NFET, active area 20B (in either order or simultaneously). The end result is that the active areas (or islands, or mesas) 20A and 20B are electrically separated and isolated from one another by the underlying BOX layer 12.

Figure 9:
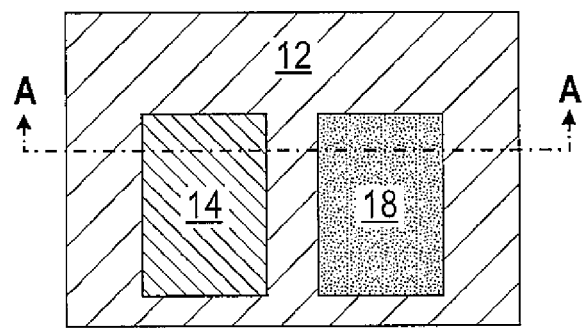
Figure 9A:
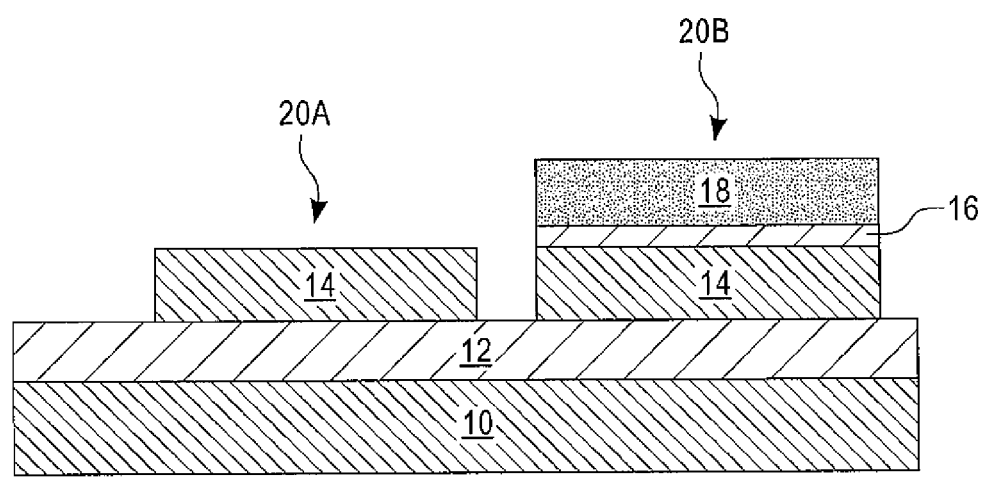

FIGS. 9 and 9A show a top view and a cross-sectional view, respectively, of the structure of FIG. 8 after further processing to differentiate the PFET and NFET active areas. The view of FIG. 9A is taken along the section line 'A' shown in FIG. 9. In this step a differentiation is made between the PFET active region 20A and the NFET active region 20B by masking the NFET active region 20B and then removing the dielectric layer 14 and the overlying layer 16 of the selected Group III-V material from the PFET region 20A to expose the SiGe layer 14.

Figure 10:
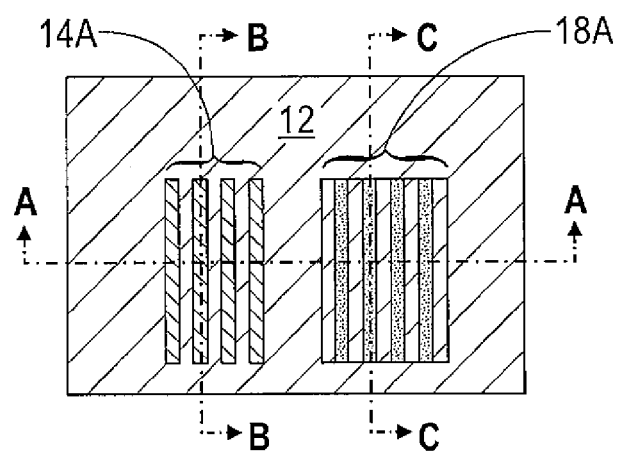
Figure 10A:
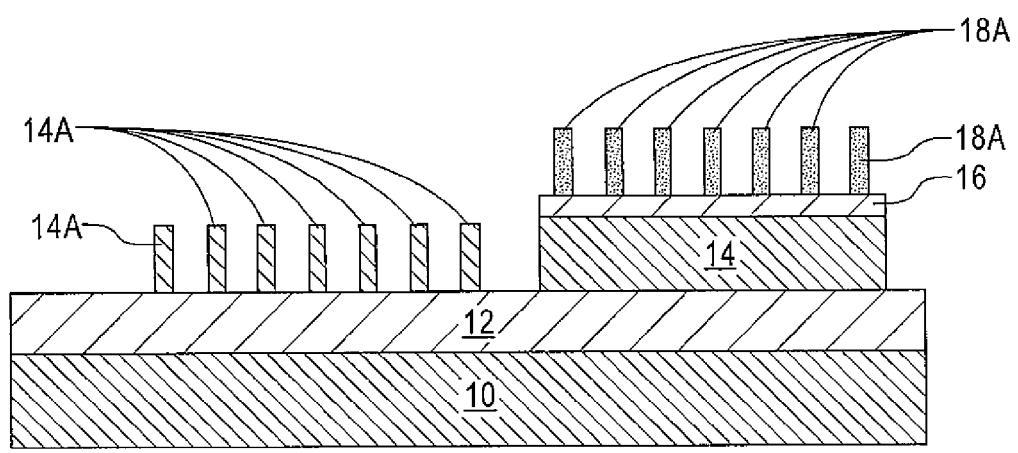
Figure 10B:
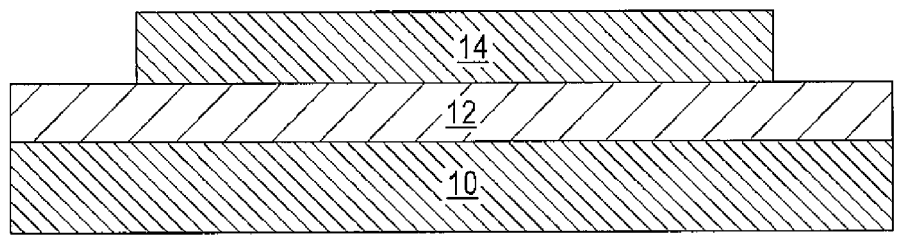
Figure 10C:
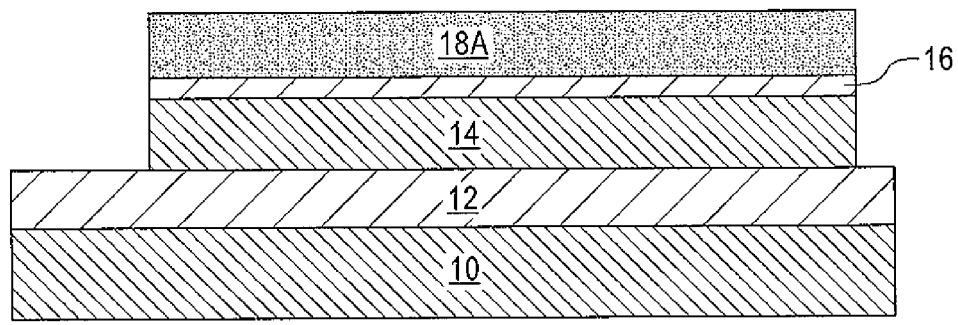

FIGS. 10, 10A, 10B and 10C show a top view and three cross-sectional views of the structure after two sets of fins are defined in the SiGe layer 14 (fins 14A) and in the Group III-V layer 18 (fins 18A). The view of FIG. 10A is taken along the section line 'A' shown in FIG. 10, the view of FIG. 10B is taken along the section line 'B' shown in FIG. 10 (through a fin 14A), and the view of FIG. 10C is taken along the section line 'C' shown in FIG. 10 (through a fin 18A). The fins 14A and 18A can each have a height that corresponds to the thickness of the respective layer from which they are formed or, in this example, about 25 nm. The fin widths can be in a range of, by example, about 5 nm to about 10 nm and they can have any desired length. Any number of fins can be formed in each set.

Fin formation can use any conventional technique, such as selectively masking and etching (e.g., a reactive ion etch (RIE)) with a chemistry selective to the material from which the fins are formed.

FIGS. 11, 11A, 11B and 11C show a top view and three cross-sectional views of the structure after gates 22 are defined orthogonally to the fins 14A and 18A. The view of FIG. 11A is taken along the section line 'A' shown in FIG. 11, the view of FIG. 11B is taken along the section line 'B' shown in FIG. 11 (through a fin 14A), and the view of FIG. 11C is taken along the section line 'C' shown in FIG. 11 (through a fin 18A). In this example a first gate 22A is associated with fins 14A and a second gate 22B is associated with fins 18A.

The gates 22 can be 'final' metal gates as shown or they can be gate electrode placeholder or gate precursors or 'dummy' gates that are subsequently removed during a replacement gate process. Where a gate 22 intersects a fin 14A or 18A it covers the fin on the top and opposing side surfaces as shown in FIG. 11A.

When the gates 22 are placeholder or precursor or 'dummy' gates they can be subsequently removed by a dry etch or wet etch process. In one embodiment the gate electrode precursor can be comprised of polycrystalline silicon or amorphous silicon and can be removed for example with a dry etch process comprising $SF_6$. In another embodiment the gate electrode precursor can be comprised of polycrystalline silicon or amorphous silicon and can be removed for example with a wet etch process comprising aqueous $NH_4OH$ or tetramethylammonium hydroxide. In an embodiment the gate electrode precursor can be comprised of silicon dioxide and can be removed by example with a wet etch comprising aqueous hydrofluoric acid, ammonium fluoride or both. In one embodiment the gate electrode precursor can be comprised of silicon nitride and can be removed for example with a wet etch comprising aqueous phosphoric acid.

When the gates 22 are 'final', metal gates they could be formed by gate dielectric deposition followed by gate metal deposition. For example, the gate dielectric can be formed as a layer 24 of high dielectric constant (high-k) material comprising a dielectric metal oxide and having a dielectric constant that is greater than the dielectric constant of silicon nitride of 7.5. The high-k dielectric layer 24 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer may be from 1 nm to 10 nm, and more preferably from about 1.5 nm to about 3 nm. The high-k dielectric layer 24 can have an effective oxide thickness (EOT) on the order of, or less than, about 1 nm. The gate metal 26 can be deposited directly on the top surface of the high-k dielectric layer 24 by, for example, chemical vapor deposition (CVD), physical vapor deposition (PVD), or atomic layer deposition (ALD). As non-limiting examples the gate metal can include a metal system selected from one or more of TiN, TiC, TaN, TaC, TaSiN, HfN, W, Al and Ru, and may be selected at least in part based on the desired work function (WF) of the device (NFET or PFET). In other words a first type of gate metal 26A can be used for the PFET while a second type of gate metal 26B can be used for the NFET.

A layer 28 of dielectric material can then be deposited over the gates 22 forming gate spacers. The spacers can be formed by, for example, a conformal deposition process such as the chemical vapor deposition (CVD) or the molecular layer deposition (MLD) of silicon oxide or more preferably silicon nitride on the gates 22.

As is made apparent in FIGS. 11B and 11C the use of this approach, where the channel thickness is equal to the fin thickness when fabricating dual channel FINFETs, results in the gate height difference ΔH becoming too large. That is, ΔH=P-Fin height+the second BOX layer 16 is greater than 25 nm, where again it assumed that the maximum acceptable value for ΔH is about 15 nm. The presence of the portion of the SiGe layer 14 that underlies the N-type (Group III-V) FINFET thus results in an unacceptable topological variation being created across the top surface of the wafer.

Reference is made to FIGS. 12-18 for illustrating a fabrication method in accordance with embodiments of this invention that beneficially eliminates the unacceptable height variation when forming dual channel FINFETs. In these Figures certain layers that can be substantially the same as those shown in FIGS. 6-11 may be numbered accordingly.

In accordance with this invention the semiconductor-on-insulator substrate is fabricated to include a thin p-channel seed layer comprised of, e.g., SiGe. The seed layer is thinner than the desired P-type fin height and the P-type fin material is selectively regrown later in the process to a desired thickness (the total thickness of the seed layer and the regrown P-type fin material can be made equal to the thickness of the Group III-V material in the N-type fin). In this way the gate height difference is limited and within the desired tolerance, i.e., ΔH=p-channel seed layer+second BOX layer <15 nm, since only the thickness of the p-channel seed layer exists under what will be the N-type Group III-V FINFET and not the total thickness (e.g., 25 nm) of the P-type SiGe layer 14 as in FIGS. 6-11.

Figure 12:
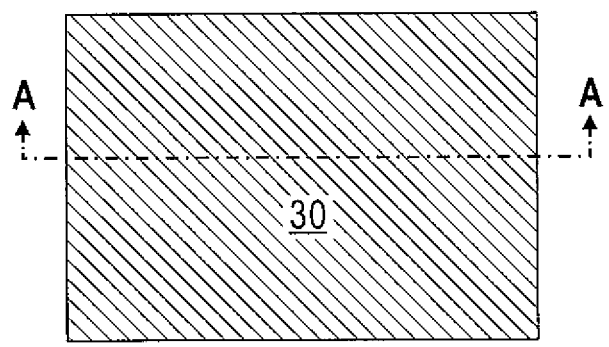
FIGS. 12-18 illustrate a fabrication method in accordance with embodiments of this invention that beneficially eliminates the unacceptable height variation when forming dual channel FINFETs.
Figure 12A:
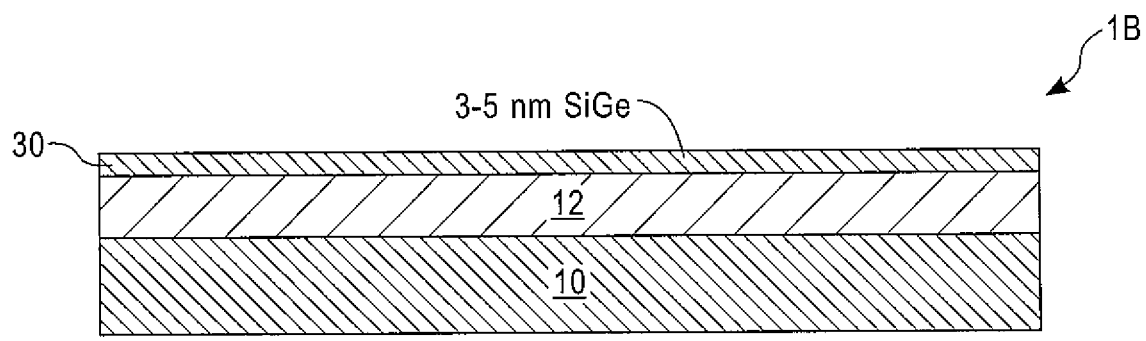

FIGS. 12 and 12A show a top view and a cross-sectional view, respectively, of an initial starting structure 1B. The view of FIG. 12A is taken along the section line 'A' shown in FIG. 12. The initial structure 1B includes the substrate 10 and the overlying BOX layer 12. As before the thicknesses of the Si substrate 10 and the BOX layer 12 can be any suitable thicknesses. Over the BOX layer 12 is a semiconductor seed layer 30, such as a layer of SiGe having a thickness in a range of, for example, about 3 nm to about 5 nm. The seed layer 30 is provided to support the epitaxial growth of the P-type semiconductor material (e.g., SiGe). As before, in the ensuing description the semiconductor seed layer 30 will be assumed to be a SiGe layer although the invention is not limited for use with only SiGe.

Figure 13:
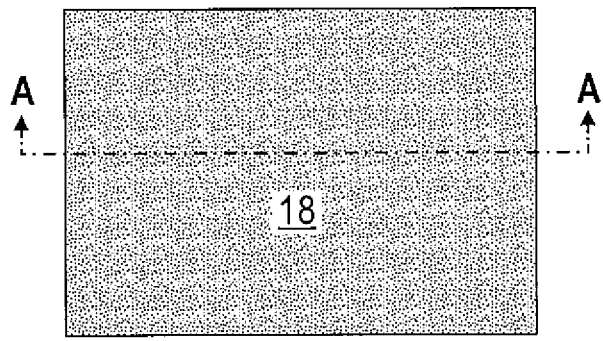
Figure 13A:
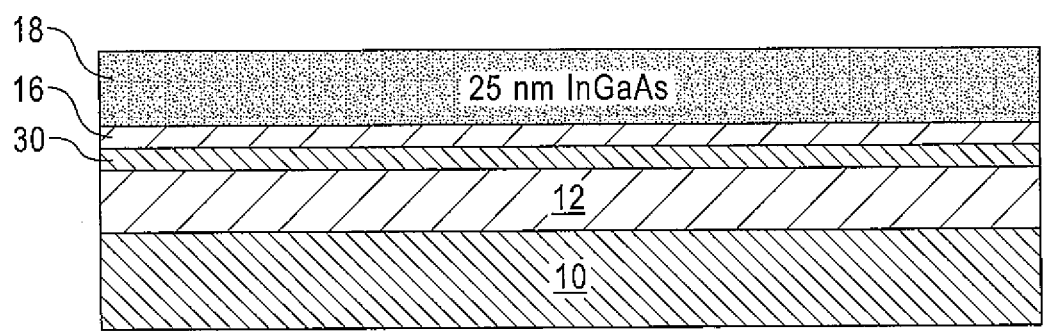

FIGS. 13 and 13A show a top view and a cross-sectional view, respectively, of the structure of FIG. 12 after further processing to add additional layers. The view of FIG. 13A is taken along the section line 'A' shown in FIG. 13. To a top surface of the SiGe seed layer 30 is formed, such as by deposition or by wafer bonding, the second (thin) dielectric layer 16, such as a layer of $SiO_2$ or $Al_2O_3$, and the overlying layer 18 of the selected Group III-V material. The Group III-V layer 18, shown again for illustration purposes and not as a limitation as a layer of InGaAs, could have a thickness of about, for example, 25 nm that corresponds to a desired fin height of the subsequently formed NFET (N-type FINFET).

Figure 14:
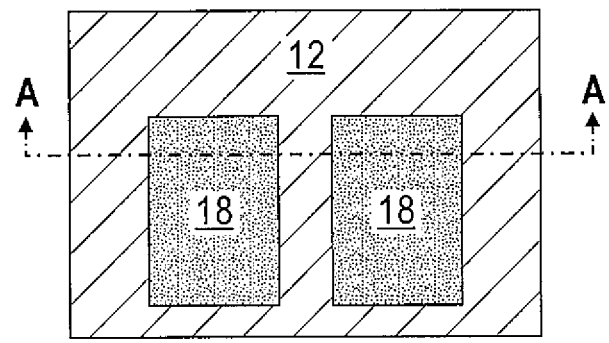
Figure 14A:
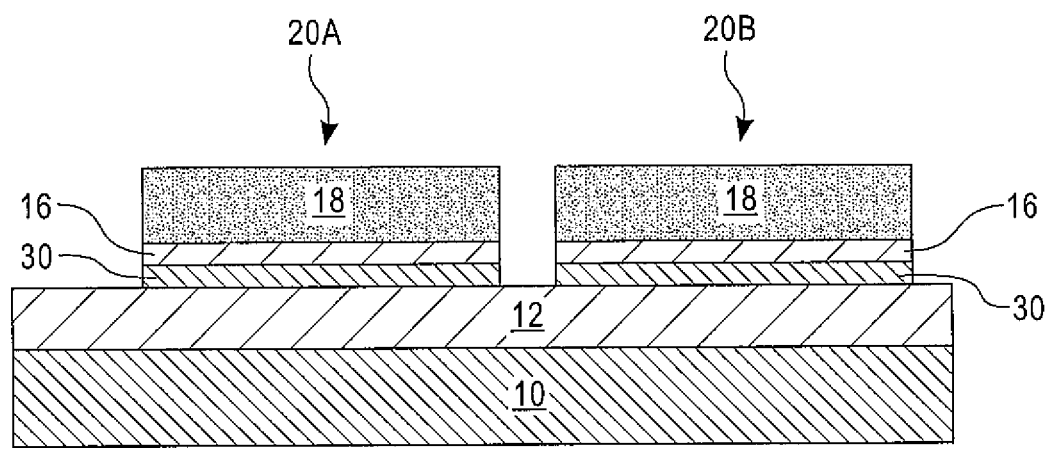

FIGS. 14 and 14A show a top view and a cross-sectional view, respectively, of the structure of FIG. 13 after further processing to form PFET and NFET active areas. The view of FIG. 14A is taken along the section line 'A' shown in FIG. 14. In this step active PFET and NFET region definition is accomplished by forming the first, PFET, active area 20A and the second, NFET, active area 20B (in either order or simultaneously). The end result is that the active areas (or islands, or mesas) 20A and 20B are electrically separated and isolated from one another by the underlying BOX layer 12.

Figure 15:
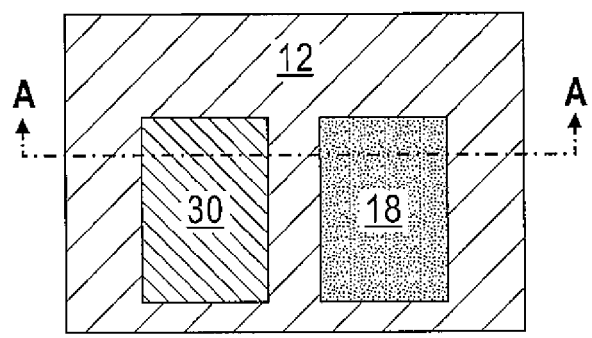
Figure 15A:
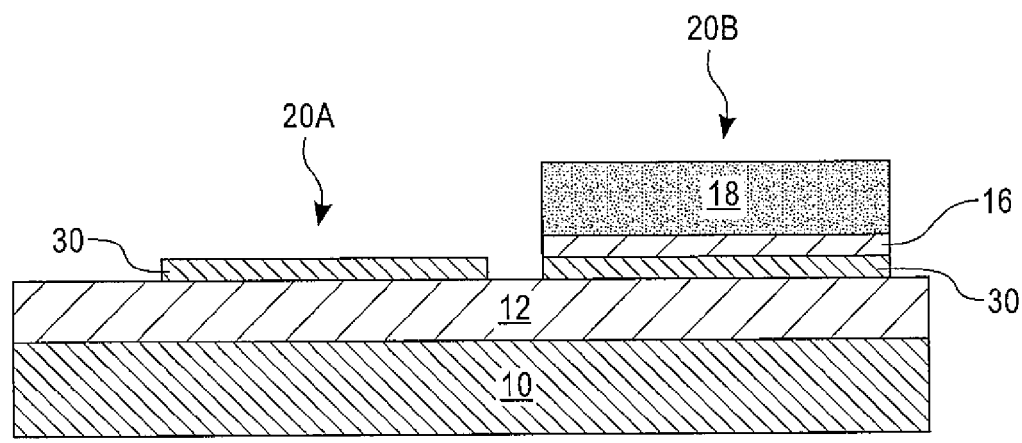

FIGS. 15 and 15A show a top view and a cross-sectional view, respectively, of the structure of FIG. 14 after further processing to differentiate the PFET and NFET active areas. The view of FIG. 15A is taken along the section line 'A' shown in FIG. 15. In this step a differentiation is made between the PFET active region 20A and the NFET active region 20B by masking the NFET active region 20B and then removing the dielectric layer 14 and the overlying layer 16 of the selected Group III-V material from the PFET region 20A to expose the SiGe seed layer 30.

Figure 16:
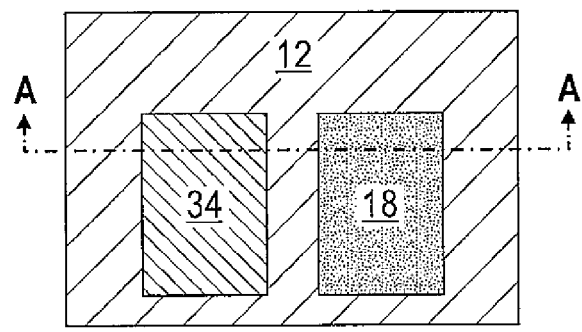
Figure 16A:
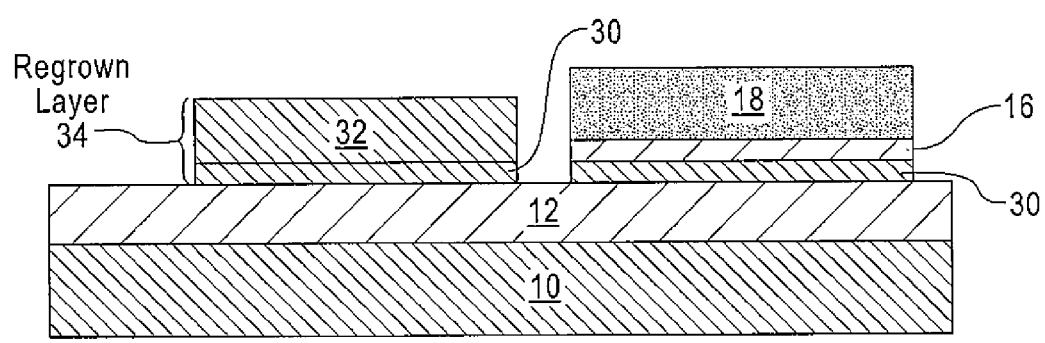

FIGS. 16 and 16A show a top view and a cross-sectional view, respectively, of the structure of FIG. 15 after further processing in accordance with embodiments of this invention to epitaxially grow an additional thicker merged layer 32 of P-type semiconductor material (e.g., SiGe) on the exposed surface of the SiGe seed layer 30. The regrowth of the SiGe layer 32 is performed to achieve a desired PFET fin thickness (e.g., 25 nm, or about the same thickness as the Group III-V layer 18). The regrowth of the SiGe layer 32 forms, in conjunction with the SiGe seed layer 30, a composite regrown layer 34 having the desired thickness.

The SiGe layer 32 can be grown using any conventional and suitable epitaxial growth process. For example the SiGe layer 32 can be formed by the epitaxial growth of SiGe using a mixture of silane, dichlorosilane and germane gases by a chemical vapor deposition (CVD) process, such as a (high vacuum) CVD process with $Si_2H_6$ and $GeH_4$ gas species. The NFET area is preferably masked prior to the growth of the SiGe layer 32.

In embodiments where the seed layer 30 is instead composed of Si or Ge then a thicker Si or Ge layer can be epitaxially grown using any suitable growth process and chemistry.

Figure 17:
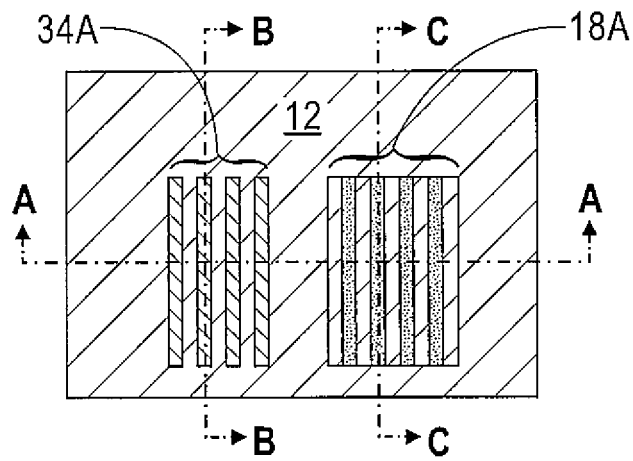
Figure 17A:
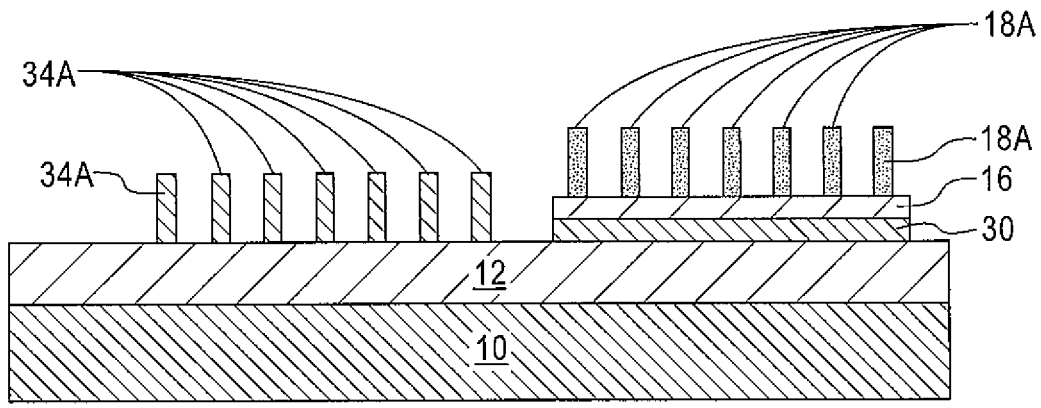
Figures 17B, 17C:
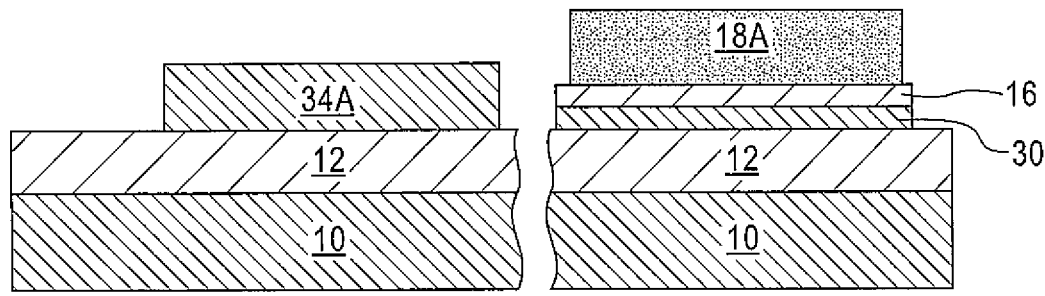
Figure 18:
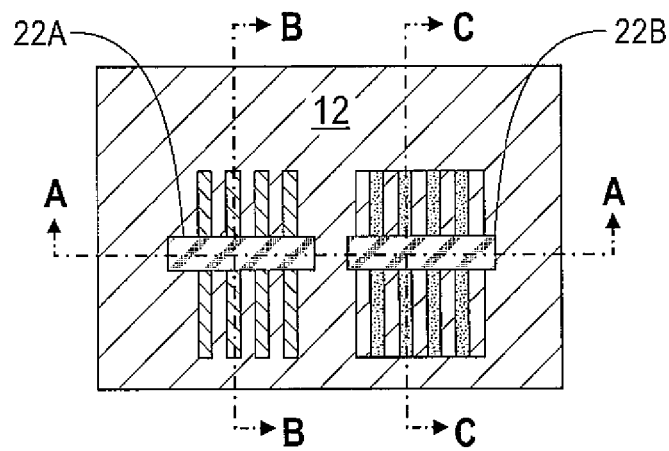

The processing shown in FIGS. 17 and 18 can proceed in the same or a similar manner as the processing shown above in FIGS. 10 and 11. More specifically, FIGS. 17, 17A, 17B and 17C show a top view and three cross-sectional views of the structure of FIG. 16 after two sets of fins are defined in the SiGe layer 34 (fins 34A) and in the Group III-V layer 18 (fins 18A). The view of FIG. 17A is taken along the section line 'A' shown in FIG. 17, the view of FIG. 17B is taken along the section line 'B' shown in FIG. 17 (through a fin 34A), and the view of FIG. 17C is taken along the section line 'C' shown in FIG. 17 (through a fin 18A). The fins 34A and 18A can each have a height that corresponds to the thickness of the respective layer from which they are formed (e.g., about 25 nm). As before, the fin widths can be in a range of, by example, about 5 nm to about 10 nm and they can have any desired length. Any number of fins can be formed in each set. Fin formation can use any conventional technique, such as selectively masking and etching (e.g., a reactive ion etch (RIE)) with a chemistry selective to the material from which the fins are formed.

Figure 18A:
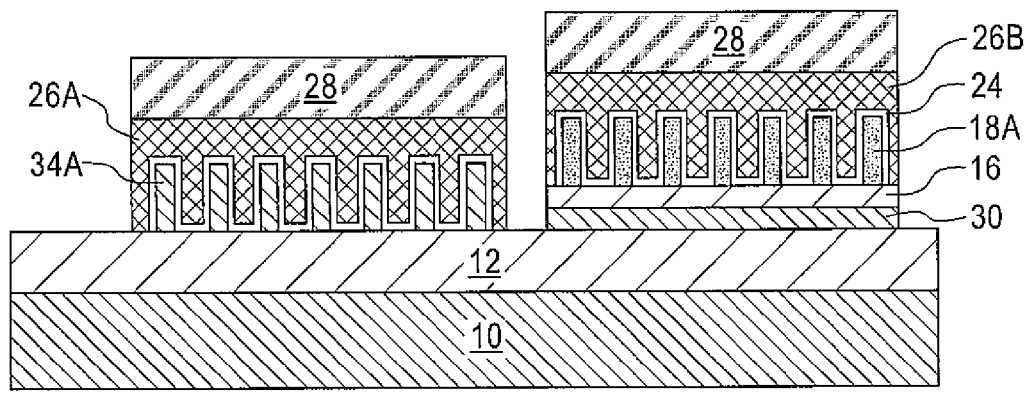
Figures 18B, 18C:
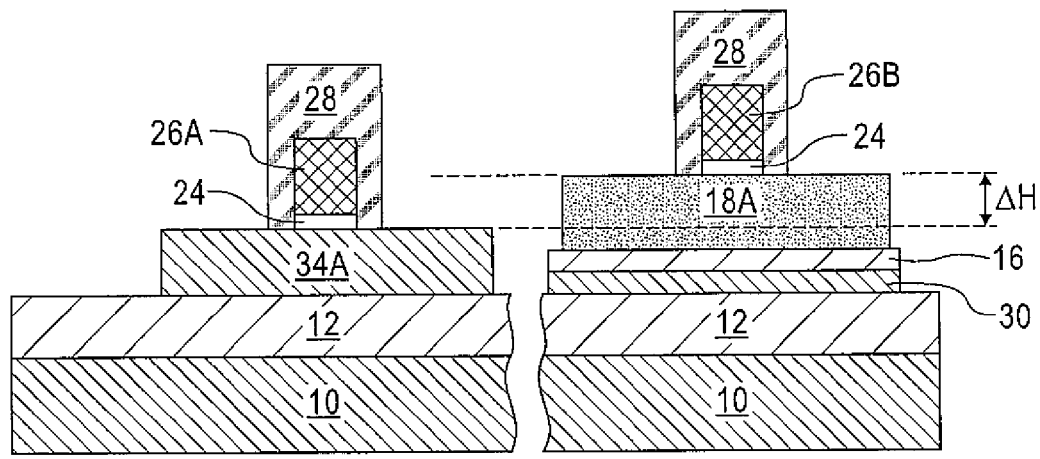

FIGS. 18, 18A, 18B and 18C show a top view and three cross-sectional views of the structure after the gates 22 are defined orthogonally to the fins 34A and 18A. The view of FIG. 18A is taken along the section line 'A' shown in FIG. 18, the view of FIG. 18B is taken along the section line 'B' shown in FIG. 18 (through a fin 34A), and the view of FIG. 18C is taken along the section line 'C' shown in FIG. 18 (through a fin 18A). In this example the first gate 22A is associated with fins 34A and the second gate 22B is associated with fins 18A. The gates could be final metal gates or placeholder dummy gates, and the gate dielectric, gate metal and spacers can be formed as described above.

Processing can then continue in the conventional fashion, for example, by growing epitaxial extension/source/drains on the NFET and the PFET and depositing a contact inter-layer dielectric (ILD) layer followed by planarization. For the replacement gate process the precursor or dummy gate structures are first replaced with metal gates over a high-k dielectric layer (as was mentioned above). Apertures are opened in the ILD layer and suitable contact metallization is then applied to the source, drain and the gate (stack/structure) of each of the FINFETs thus formed.

As can be readily seen in FIGS. 18B and 18C the gate height difference is reduced and within the desired tolerance. That is, AH is equal to the thickness of the p-channel seed layer 30 plus the thickness of the second BOX layer 16 and can be made less than 15 nm, since only the thickness of the p-channel seed layer exists under the N-type Group III-V FINFET and not the total thickness (e.g., 25 nm) of the P-type SiGe layer 14 as was shown in FIGS. 6-11.

It is to be understood that the exemplary embodiments discussed above with reference to the Figures can be used on common variants of FET devices including, e.g., FET devices with multi-fingered FIN and/or gate structures as well as FET devices of varying gate width and length.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, regrowth processes and etching processes may be used by those skilled in the art. Further, the exemplary embodiments are not intended to be limited to only those semiconductor materials, metals, insulators, layer thicknesses and the like that were specifically disclosed above.

Any and all such and similar modifications of the teachings of this invention will still fall within the scope of this invention.

What is claimed is:

1. A method, comprising:
providing a structure comprised of a substrate, a first electrically insulating layer overlying a surface of the substrate, a first semiconductor layer comprised of a first semiconductor material overlying a surface of the first electrically insulating layer, the first semiconductor layer having a first thickness, a bottom surface disposed on the first electrically insulating layer and a top surface, a second electrically insulating layer disposed on the top surface of the first semiconductor layer and overlying the first semiconductor layer in a first portion of the structure, and a second semiconductor layer comprised of a second semiconductor material different from the first semiconductor material overlying the second electrically insulating layer in the first portion, the second semiconductor layer having a second thickness that is greater than the first thickness;
removing the second electrically insulating layer and the second semiconductor layer in a second portion of the structure to expose the top surface of the first semiconductor layer;
growing additional first semiconductor material on the exposed top surface of the first semiconductor layer in the second portion of the structure to forma regrown semiconductor layer having a third thickness;
forming first fins in the regrown semiconductor layer and second fins in the second semiconductor layer; and
forming gate structures upon and orthogonal to the first fins and the second fins, where a difference in height, relative to the surface of the first electrically insulating layer, of the gate structures formed upon the first fins and the gate structures formed upon the second fins is less than a predetermined value.

2. The method of claim 1, where providing the structure comprises bonding a first structure comprised of the substrate, the first electrically insulating layer and the first semiconductor layer to a second structure comprising the second electrically insulating layer and the second semiconductor layer.

3. The method of claim 1, where forming gate structures comprises forming metal gate structures.

4. The method of claim 1, where forming gate structures comprises forming precursor gate structures.

5. The method of claim 1, where the third thickness is approximately equal to the second thickness.

6. The method of claim 1, where the predetermined value is approximately 15 nm.

7. The method of claim 1, where the first semiconductor layer is a seed semiconductor layer having a thickness in a range of about 3 nm to about 5 nm.

8. The method of claim 1, where the first semiconductor material is comprised of $Si_xGe_{1-x}$ where x=0 to 1, and where the second semiconductor material is comprised of a Group III-V semiconductor material.

9. The method of claim 1, where the first semiconductor material is one selected to exhibit a higher mobility for holes relative to the second semiconductor material, where the second semiconductor material is one selected to exhibit a higher mobility for electrons relative to the first semiconductor material, and where the first portion is a portion of the structure in which an NFET is to be formed, and where the second portion is a portion of the structure in which a PFET is to be formed.

10. A method, comprising:
providing a structure comprised of a substrate, the structure further comprising
a first electrically insulating layer overlying a surface of the substrate,
a first semiconductor layer comprised of $Si_xGe_{1-x}$, where x=0 to 1, the first semiconductor layer overlying a top surface of the first electrically insulating layer and having a first thickness, a bottom surface disposed on the top surface of the first electrically insulating layer and a top surface,
a second electrically insulating layer disposed on the top surface of the first semiconductor layer and overlying the first semiconductor layer, and
a second semiconductor layer comprised of a Group III-V semiconductor material overlying the second electrically insulating layer, the second semiconductor layer having a second thickness that is greater than the first thickness;
forming a first active mesa area and a second active mesa area each containing a portion of the first semiconductor layer, the second electrically insulating layer and the second semiconductor layer, the first active mesa area being disposed on and electrically separated from the second active mesa area by the top surface of the first electrically insulating layer;
removing from the first active mesa area the second electrically insulating layer and the second semiconductor layer to expose the top surface of the first semiconductor layer that is contained in the first active mesa area;
growing additional $Si_xGe_{1-x}$ on the exposed top surface of the first semiconductor layer that is contained in the first active mesa area to form a regrown $Si_xGe_{1-x}$ semiconductor layer having a third thickness;
forming first fins in the regrown $Si_xGe_{1-x}$ semiconductor layer of the first active mesa area and second fins in the Group III-V semiconductor material of the second semiconductor layer of the second active mesa area; and
forming gate structures upon and orthogonal to the first fins and the second fins, where
a difference in height, relative to the surface of the first electrically insulating layer, of the gate structures formed upon the first fins and the gate structures formed upon the second fins is less than a predetermined value.

11. The method of claim 10, where providing the structure comprises wafer bonding a first structure comprised of the substrate, the first electrically insulating layer and the first semiconductor layer to a second structure comprising the second electrically insulating layer and the second semiconductor layer.

12. The method of claim 10, where the third thickness is approximately equal to the second thickness.

13. The method of claim 10, where the predetermined value is approximately 15 nm.

14. The method of claim 10, where the first semiconductor layer has a thickness in a range of about 3 nm to about 5 nm.

15. The method of claim 10, where the first active mesa area is a PFET active area and where the second active mesa area is an NFET active area.

* * * * *